(12) United States Patent
Cheng et al.

(10) Patent No.: US 11,177,169 B2
(45) Date of Patent: Nov. 16, 2021

(54) INTERCONNECTS WITH GOUGED VIAS

(71) Applicant: International Business Machines Corporation, Armonk, NY (US)

(72) Inventors: Kenneth Chun Kuen Cheng, Albany, NY (US); Koichi Motoyama, Clifton Park, NY (US); Chih-Chao Yang, Glenmont, NY (US); Hosadurga Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/448,315

(22) Filed: Jun. 21, 2019

(65) Prior Publication Data
US 2020/0402844 A1 Dec. 24, 2020

(51) Int. Cl.
*H01L 21/768* (2006.01)

(52) U.S. Cl.
CPC .. *H01L 21/76846* (2013.01); *H01L 21/76877* (2013.01); *H01L 21/76895* (2013.01)

(58) Field of Classification Search
CPC ......... H01L 21/76846; H01L 21/76877; H01L 21/76895
USPC .................................. 438/618, 622
See application file for complete search history.

(56) References Cited

U.S. PATENT DOCUMENTS

| | | | |
|---|---|---|---|
| 5,470,790 A | 11/1995 | Myers et al. | |
| 6,613,664 B2 | 9/2003 | Barth et al. | |
| 6,787,448 B2 | 9/2004 | Chung | |
| 6,812,577 B2 * | 11/2004 | Lee | H01L 21/76805 257/774 |
| 6,924,221 B2 | 8/2005 | Shen | |
| 7,329,605 B2 | 2/2008 | Jones et al. | |
| 7,332,428 B2 * | 2/2008 | Beck | H01L 21/76805 257/622 |
| 7,622,391 B2 * | 11/2009 | Frohberg | H01L 21/76804 257/E21.485 |
| 7,964,966 B2 * | 6/2011 | Yang | H01L 21/76805 257/751 |
| 7,968,506 B2 | 6/2011 | Chou et al. | |
| 9,935,051 B2 | 4/2018 | Adusumilli et al. | |
| 2002/0109234 A1 * | 8/2002 | Park | H01L 21/76805 257/767 |
| 2009/0032961 A1 | 2/2009 | Feustel et al. | |
| 2009/0243116 A1 * | 10/2009 | Feustel | H01L 21/76807 257/773 |
| 2010/0038788 A1 | 2/2010 | Kim et al. | |
| 2010/0264543 A1 | 10/2010 | Ponoth et al. | |
| 2011/0100697 A1 | 5/2011 | Yang et al. | |

OTHER PUBLICATIONS

Anonymous, "Sacrificial Liner for Contact Gouge Feature in Cu Integration", IP.com Electronic Publication Date: Apr. 15, 2010; pp. 1-6.

* cited by examiner

*Primary Examiner* — Dale E Page
*Assistant Examiner* — Quovaunda Jefferson
(74) *Attorney, Agent, or Firm* — Cantor Colburn LLP; L. Jeffrey Kelly

(57) ABSTRACT

A method of fabricating a semiconductor device includes depositing a spacer material in a trench arranged in a dielectric layer. An end of the trench extends to a metal layer of an interconnect structure. A portion of the spacer material in contact with the metal layer is removed. A recess is formed in the metal layer at the end of the trench.

12 Claims, 10 Drawing Sheets

INTERCONNECTS WITH GOUGED VIAS

BACKGROUND

The present invention generally relates to fabrication methods and resulting structures for semiconductor devices. More specifically, the present invention relates to methods and resulting structures for semiconductor devices having interconnects with gouged vias.

Generally, integrated circuits (ICs) are formed from interconnected semiconductor devices fabricated on a semiconductor substrate. A complex network of signal paths is routed to connect the circuit elements distributed on the surface of the substrate. To efficiently route these signals across the device, multilevel or multilayered schemes are used, for example, single or dual damascene wiring structures. The wiring structure can include, for example, copper or a copper alloy.

Within an interconnect structure, metal vias run substantially normal to the semiconductor substrate. Metal lines run substantially parallel to the semiconductor substrate. The signal speed can be enhanced, and "crosstalk" between signals in adjacent lines can be reduced, by embedding the metal lines and metal vias (e.g., conductive features) within a low-k dielectric material.

SUMMARY

Embodiments of the present invention are directed to a method for fabricating a semiconductor device. A non-limiting example of the method includes depositing a spacer material in a trench arranged in a dielectric layer. An end of the trench extends to a metal layer of an interconnect structure. A portion of the spacer material in contact with the metal layer is removed. A recess is formed in the metal layer at the end of the trench.

Another non-limiting example of the method includes depositing a spacer material in a trench arranged in a dielectric layer. An end of the trench extends to a metal layer of an interconnect structure. A portion of the spacer material in contact with the metal layer is removed. A recess is formed in the metal layer at the end of the trench. A first metal is deposited in the recess to fill the recess in the metal layer. A second metal is deposited on the first metal to fill the trench.

Embodiments of the present invention are directed to a semiconductor device. A non-limiting example of the semiconductor device includes a trench arranged in a dielectric layer. An end of the trench extends to a metal layer of an interconnect structure. A spacer material is arranged on a sidewall of trench, and a recess is arranged in the metal layer at the end of the trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-8 depict a process flow for forming a semiconductor device according to embodiments of the present invention, in which:

FIG. 1 depicts a cross-sectional side view of a semiconductor device including a metal layer arranged on a substrate;

FIG. 2 depicts a cross-sectional side view of the semiconductor device, subsequent to depositing a cap layer and a dielectric layer on the metal layer;

FIG. 3 depicts a cross-sectional side view of the semiconductor device, subsequent to forming a trench through the dielectric layer and the cap layer to the metal layer;

FIG. 4 depicts a cross-sectional side view of the semiconductor device, subsequent to depositing a spacer layer in the trenches;

FIG. 5 depicts a cross-sectional side view of the semiconductor device, subsequent to removing a portion of the spacer layer;

FIG. 6 depicts a cross-sectional side view of the semiconductor device, subsequent to removing a portion of the metal layer at the end of the trench to form a recess in the metal layer;

FIG. 7 depicts a cross-sectional side view of the semiconductor device, subsequent to removing remaining portions of the spacer layer; and FIG. 8 depicts a cross-sectional side view of the semiconductor device, subsequent to depositing a barrier, liner, and metal in the trench;

FIGS. 9-10 depict a process flow for forming a semiconductor device according to embodiments of the present invention, in which:

FIG. 9 depicts a cross-sectional side view of the semiconductor device, following FIG. 7, subsequent to depositing a metal in the recess in the metal layer; and FIG. 10 depicts a cross-sectional side view of the semiconductor device, subsequent to depositing a barrier, liner, and metal in the trench.

Figure 1:
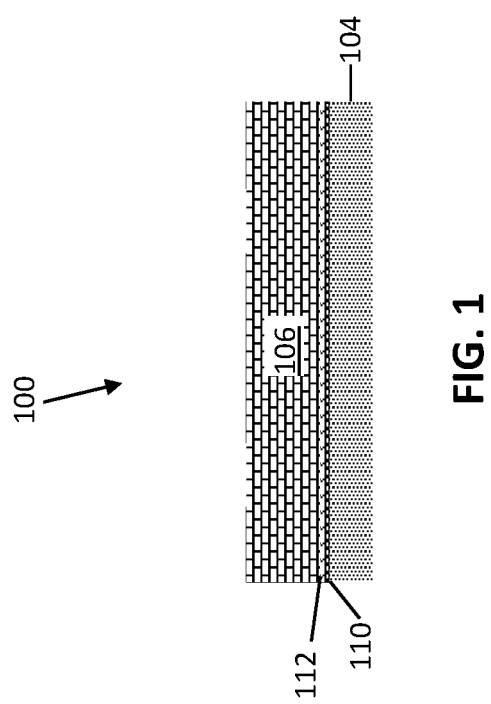

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, metal vias are arranged substantially normal to metal lines in an interconnect structure. Recessing the via trench such that it extends into the metal line before depositing the via metal fill can increase the interfacial area between the via and the metal line, which improves overall device resistance. The metal line can be recessed by, for example, wet or dry etching processes. However, there are challenges associated with wet etching and dry etching to increase the interfacial area. Wet etching the metal line at the end of the via is an unreliable process because it can over-etch the metal and result in an undesired U-shaped undercut beneath the dielectric layer. While dry etching can avoid the undesired undercut and form a V-shaped or cone-shaped recess in the metal line, dry etching also can damage the dielectric layer when not properly protected with an additional protective layer.

Turning now to an overview of the aspects of the invention, one or more embodiments of the invention address the above-described shortcomings of the prior art by providing processes and resulting structures that include lining the via trench sidewalls with a sacrificial spacer and wet etching the metal layer at the end of the trench. An undercut will form beneath the sacrificial spacer, and the sacrificial spacer can be removed.

The above-described aspects of the invention address the shortcomings of the prior art by creating gouged vias in the metal layer of an interconnect structure without undesired and unreliable undercuts or damaged dielectric layers. The sacrificial spacer protects the outer edges of the exposed metal line, and wet etching will not damage the dielectric layer. The gouged vias increase the interfacial area to improve overall device resistance.

Turning now to a more detailed description of aspects of the present invention, FIGS. 1-8 depict a process flow for forming a semiconductor device 100 according to embodiments of the present invention. FIG. 1 depicts a cross-sectional side view of the semiconductor device 100 including a metal layer 106 arranged on a substrate 104.

The substrate 104 can include a semiconducting material, a conducting material, an insulating material, or any combination thereof. When the substrate 104 includes a semiconducting material, any material having semiconductor properties such as, for example, Si, SiGe, SiGeC, SiC, Ge alloys, GaAs, InAs, InP and other III/V or II/VI compound semiconductors, can be used. The substrate 104 can be a layered semiconductor such as, for example, Si/SiGe, Si/SiC, silicon-on-insulators (SOIs) or silicon germanium-on-insulators (SGOIs). When the substrate 104 includes an insulating material, the insulating material can be an organic insulator, an inorganic insulator or a combination thereof, including multilayers. When the substrate 104 includes a conducting material, the substrate 104 can include, for example, polysilicon, an elemental metal, alloys of elemental metals, a metal silicide, a metal nitride or any combination thereof, including multilayers. When the substrate 104 includes a semiconducting material, one or more semiconductor devices such as, for example, complementary metal oxide semiconductor (CMOS) devices can be fabricated thereon. When the substrate 104 includes a combination of an insulating material and a conductive material, the substrate 104 can represent an underlying interconnect level of a multilayered interconnect structure.

A barrier layer 110 is arranged on the substrate 104, and a liner 112 is arranged on the barrier layer 112. The barrier layer 110 prevents metal diffusion into the substrate 104. Non-limiting examples of materials for the barrier layer 110 include tantalum (Ta), tantalum nitride (TaN), titanium (Ti), titanium nitride (TiN), cobalt (Co), tungsten, ruthenium (Ru), ruthenium tantalum (RuTa), or any combination thereof. The barrier layer 110 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The liner 112 is an optional plating seed layer formed on the surface of the barrier layer 110. The liner 112 selectively promotes subsequent electroplating of a pre-selected conductive metal or metal alloy. The liner 112 can include, for example, copper (Cu), a Cu alloy, cobalt (Co), iridium (Ir), an Ir alloy, ruthenium (Ru), a Ru alloy (e.g., TaRu alloy) or other noble metal or noble metal alloy having a low metal-plating over-potential.

The metal layer 106 forms a metal line of an interconnect structure on the liner 112. The metal layer 106 can include, for example, polySi, SiGe, a conductive metal, an alloy including at least one conductive metal, a conductive metal silicide or combinations thereof. The conductive material can be a conductive metal, such as copper (Cu), tungsten (W), aluminum (Al), cobalt (Co), ruthenium (Ru), rhodium (Rh), platinum (Pt), or any combination thereof. In one or more embodiments of the present invention, the conductive material of the metal layer 106 includes Cu or a Cu alloy. The conductive material forming the metal layer 106 is deposited by a deposition process, including, by not limited to, chemical vapor deposition (CVD), plasma enhanced chemical vapor deposition (PECVD), sputtering, chemical solution deposition or plating that fills from the bottom upwards (e.g., a bottom-up plating process).

Figure 2:
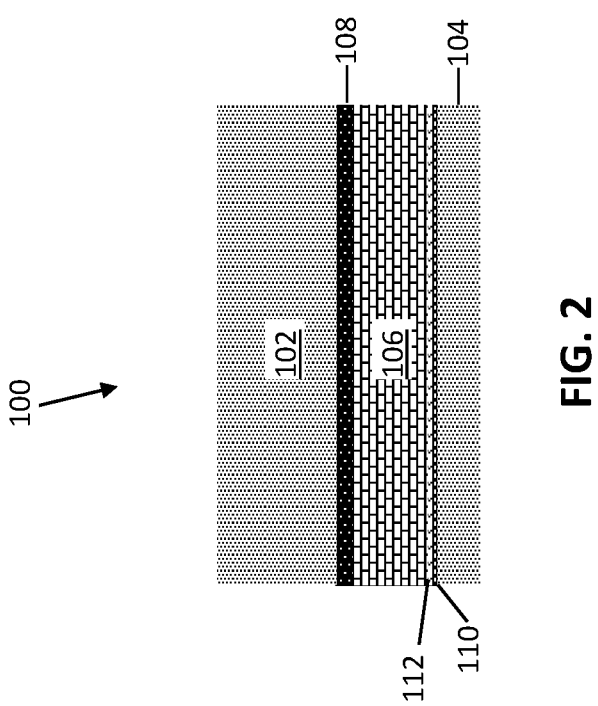

FIG. 2 depicts a cross-sectional side view of the semiconductor device 100, subsequent to depositing a cap layer 108 and a dielectric layer 102 on the metal layer 106. The cap layer 108 includes a dielectric material. Non-limiting examples of materials for the cap layer 108 include a nitride (e.g., silicon nitride) or a carbide (e.g., silicon carbide).

The dielectric layer 102 includes an inter-level dielectric (ILD), such as an inorganic dielectric or organic dielectric. The ILD is deposited by a deposition process, including, but not limited to CVD, PVD, plasma enhanced CVD, atomic layer deposition (ALD), evaporation, chemical solution deposition, or like processes. Non-limiting examples of ILD materials include $SiO_2$, silsesquioxanes, carbon-doped oxides (i.e., organosilicates) that include atoms of Si, C, O and H, thermosetting polyarylene ethers, or multilayers thereof. The ILD can be a low-k or ultra-low-k dielectric material with a dielectric constant that is about 4.0 or less, or a dielectric constant of about 2.8 or less.

Figure 3:
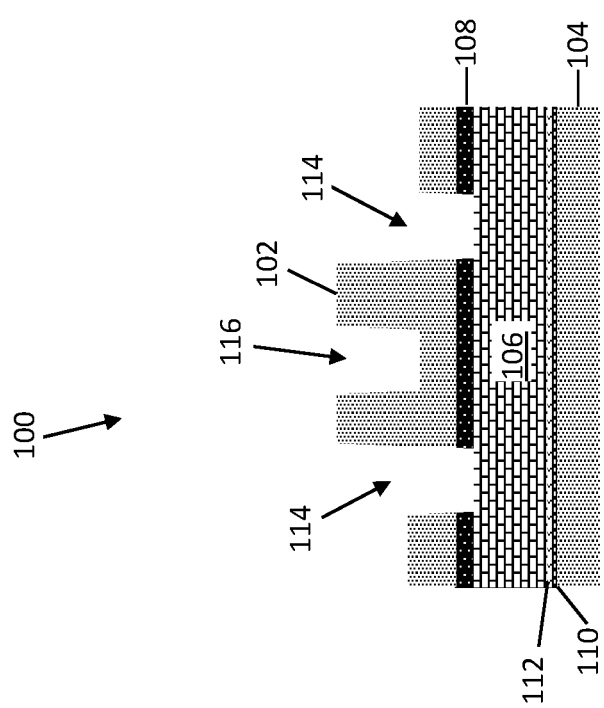

FIG. 3 depicts a cross-sectional side view of the semiconductor device 100, subsequent to forming trenches 114 through the dielectric layer 102 and the cap layer 108 to expose the metal layer 106. Although two trenches 114 are shown, any number of trenches can be formed, provided that at least one is formed. The end of the trench 114 extends to the metal layer 106 of the interconnect structure. The trenches 114 will form the vias that are arranged normal to the metal layer 106. In some embodiments of the present invention, at least one trench 116 can be formed that does not extend to the metal layer 106. The trench 116 is arranged normal to the trenches 114 forming the vias 114.

Figure 4:
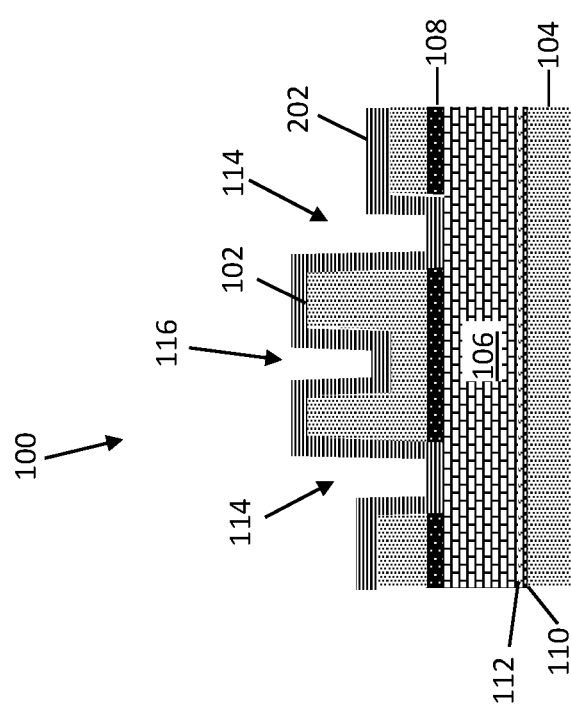

FIG. 4 depicts a cross-sectional side view of the semiconductor device 100, subsequent to depositing a spacer layer 202 in the trenches 114, 116 of the dielectric layer 102. The spacer layer 202 includes a sacrificial spacer material that will be subsequently removed. The spacer layer 202 covers and lines the sidewalls of the trenches 114, 116 in the dielectric layer 102, as well as the exposed surface of the metal layer 106.

Non-limiting examples of materials for the spacer layer 202 include metals, e.g., tantalum (Ta), copper (Cu), cobalt (Co), ruthenium (Ru), titanium (Ti), and tungsten (W)); metal nitrides, e.g., tantalium nitride, silicon nitride, and hydrogen-doped silicon nitride; metal oxides, e.g., silicon oxide, CuO, and $Al_2O_3$; polymers, e.g., poly-p-xylylene; or any combination thereof.

The thickness of the spacer layer 202 can vary depending on the deposition process used as well as the material employed. In some embodiments, the spacer layer 202 has a thickness in a range from about 1 nm to about half of the width of the via 114.

Figure 5:
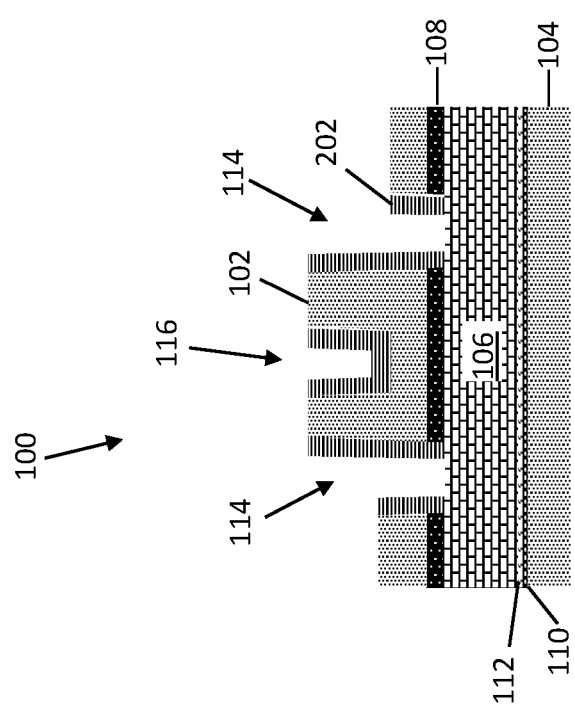

FIG. 5 depicts a cross-sectional side view of the semiconductor device 100, subsequent to removing a portion of the spacer layer 202. The spacer layer 202 contacting the metal layer 106 and surfaces of the dielectric layer 102 that are parallel to the substrate 104, which can also be horizontal surfaces. These portions of the spacer layer 202 can be removed by performing an anisotropic etch process in which the etch rate in the direction normal to the surface to be etched is greater than in the direction parallel to the surface to be etched. A non-limiting example of an anisotropic etch includes reactive-ion etching (ME). Other non-limiting examples of anisotropic etching processes include ion beam etching, plasma etching, laser ablation, or any combination thereof.

Figure 6:
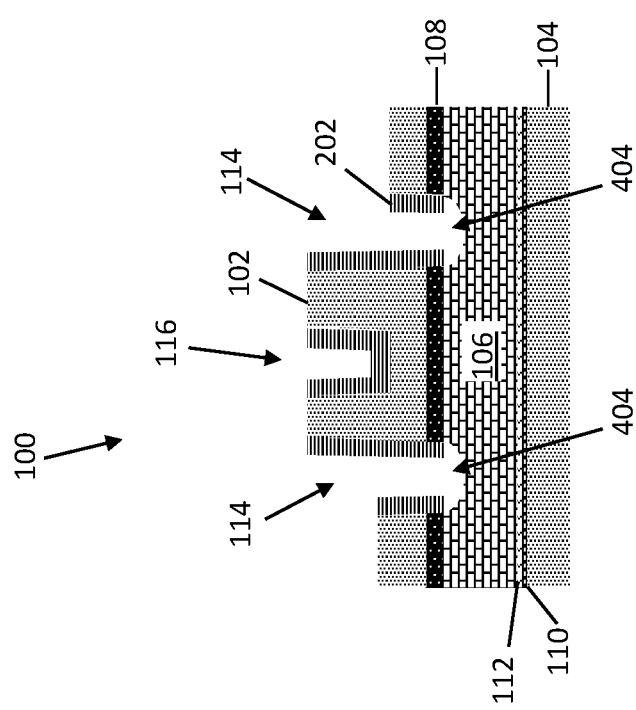

FIG. 6 depicts a cross-sectional side view of the semiconductor device 100, subsequent to removing a portion of the metal layer 106 at the end of the trench 114 to form a recess 404 in the metal layer 106. The recess 404 is a U-shaped recess or a concave recess in some embodiments of the present invention. The edges of the recess 404 extend beneath the spacer layer 202, but not passed the spacer layer 202 or beneath the dielectric layer 102. Thus, the spacer layer 202 arranged on the vertical sidewalls of the trench 114 protects and prevents from undercuts from forming beneath the dielectric layer 102 that can result during over-etching.

According to some embodiments of the present invention, a wet etch process is performed to form the recess 404. The wet etching process can include, for example, buffered hydrofluoric acid (BHF), hydrofluoric acid (HF), hydrofluoric nitric acid (HNA), phosphoric acid, HF diluted by ethylene glycol (HFEG), hot ammonia, tetramethylammonium hydroxide (TMAH), hydrochloric acid (HCl), or any combination thereof.

Figure 7:
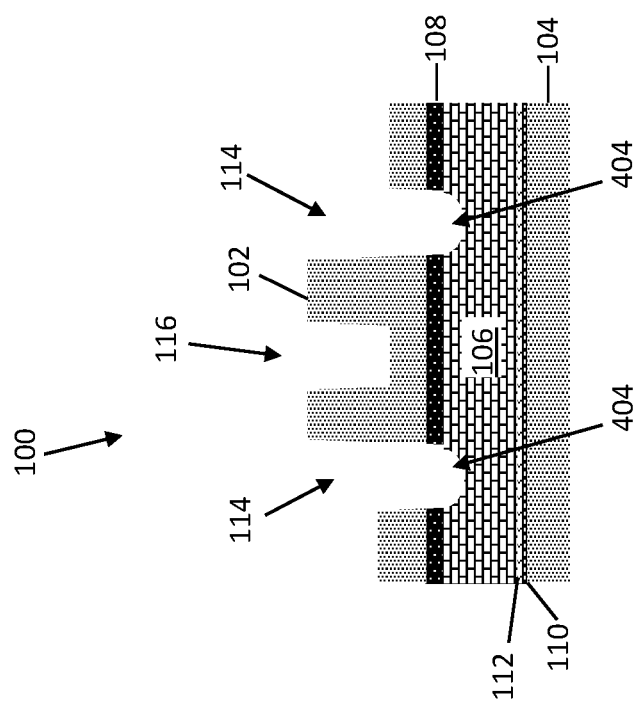

FIG. 7 depicts a cross-sectional side view of the semiconductor device 100, subsequent to removing remaining portions of the spacer layer 202. The remaining portions of the spacer layer 202 can be removed by one or more etching processes, including one or more wet etching processes and/or dry etching processes.

Figure 8:
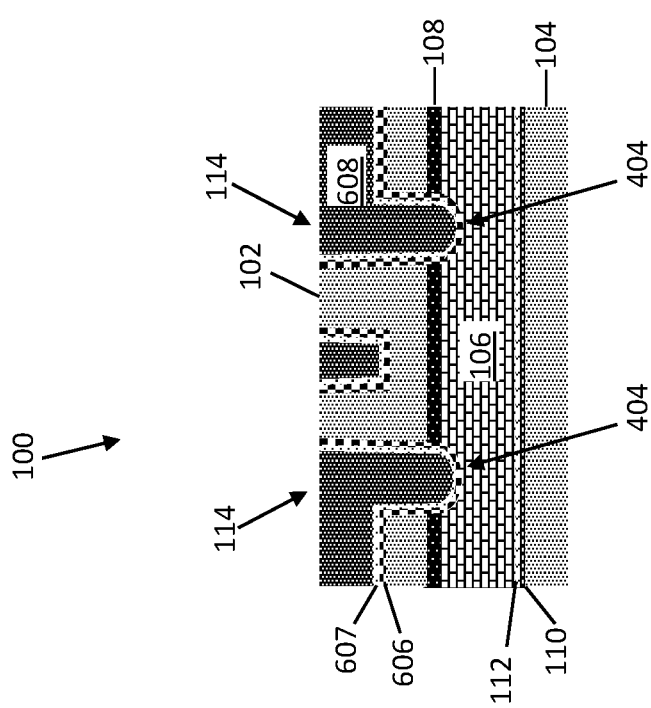

FIG. 8 depicts a cross-sectional side view of the semiconductor device 100, subsequent to depositing a barrier layer 606, liner 607, and metal 608 in the trenches 114, 116. The barrier layer 606 is arranged in the trenches 114, 116 and contacts the metal layer 106. The liner 607 is arranged on the barrier layer 112. The barrier layer 606 prevents metal diffusion into the dielectric layer 102. Non-limiting examples of materials for the barrier layer 606 include tantalum (Ta), tantalum nitride (TaN), titanium (Ti), titanium nitride (TiN), cobalt (Co), tungsten, ruthenium (Ru), ruthenium tantalum (RuTa), or any combination thereof. The barrier layer 606 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The liner 607 is an optional plating seed layer formed on the surface of the barrier layer 606. The liner 607 selectively promotes subsequent electroplating of a pre-selected conductive metal or metal alloy. The liner 607 can include, for example, copper (Cu), a Cu alloy, cobalt (Co), iridium (Ir), an Ir alloy, ruthenium (Ru), a Ru alloy (e.g., TaRu alloy) or other noble metal or noble metal alloy having a low metal-plating over-potential.

A metal 608 forming the vias of the interconnect structure is deposited on the liner 607. The metal 608 can include, for example, polySi, SiGe, a conductive metal, an alloy including at least one conductive metal, a conductive metal silicide or combinations thereof. The conductive material can be a conductive metal, such as copper (Cu), tungsten (W), aluminum (Al), cobalt (Co), ruthenium (Ru), rhodium (Rh), platinum (Pt), or any combination thereof. In one or more embodiments of the present invention, the conductive material of the metal layer 106 includes Cu or a Cu alloy. The metal 608 is deposited by a deposition process, including, by not limited to, chemical vapor deposition (CVD), plasma enhanced chemical vapor deposition (PECVD), sputtering, chemical solution deposition or plating that fills from the bottom upwards (e.g., a bottom-up plating process).

Figure 9:
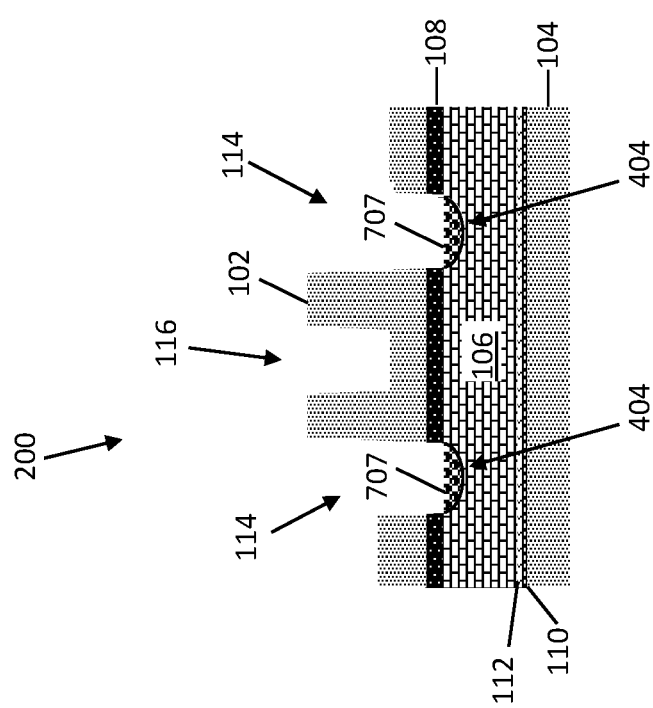
Figure 10:
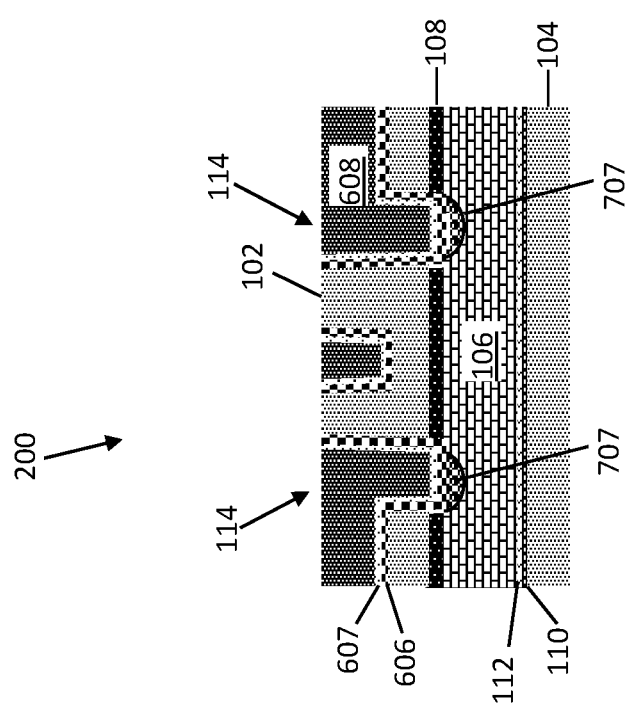

FIGS. 9-10 depict a process flow for forming a semiconductor device 200 according to embodiments of the present invention. FIG. 9 depicts a cross-sectional side view of the semiconductor device 200, following FIG. 7, subsequent to depositing a metal 707 in the recess 404 in the metal layer 106. The metal 707 is selectively deposited in the recess 404 to selectively fill the recess only. The metal 707 can be a metal that is different than the metal that will be subsequently deposited in the trench 114 to form the via (see metal 608 in FIG. 10). The metal 707 is also referred to as a first metal, and the metal 608 is also referred to as a second metal. The metal 707 can be, for example, cobalt (Co), ruthenium (Ru), or a combination thereof. The selectively deposited metal 707 between the via and the underlying metal line can improve device reliability by reducing the formation of voids that can reduce device performance.

FIG. 10 depicts a cross-sectional side view of the semiconductor device 200, subsequent to depositing a barrier layer 606, liner 607, and metal 608 in the trench 114, on top of the selectively deposited metal 707.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    depositing a spacer material in a trench arranged in a dielectric layer, an end of the trench extending to a metal layer of an interconnect structure;
    removing a portion of the spacer material in contact with the metal layer;
    forming a recess in the metal layer at the end of the trench, a portion of the metal layer directly beneath the spacer material being removed to form the recess, and lateral sidewalls of the recess not extending beyond vertical sidewalls of the spacer material; and
    removing remaining portions of the spacer material.

2. The method of claim 1, wherein the spacer material is selected from a group consisting of a metal, a metal nitride, a metal oxide, a polymer, and combinations thereof.

3. The method of claim 1, wherein removing the portion of the spacer material comprises using an anisotropic etching process.

4. The method of claim 1, wherein the metal layer is selected from a group consisting of copper, tungsten, cobalt, rhodium, platinum, and combinations thereof.

5. The method of claim 1, wherein an edge of the recess is arranged beneath the spacer material.

6. The method of claim 1 further comprising depositing a metal in the trench to form a via.

7. A method of fabricating a semiconductor device, the method comprising:
    depositing a spacer material in a trench arranged in a dielectric layer, an end of the trench extending to a metal layer of an interconnect structure;
    removing a portion of the spacer material in contact with the metal layer;
    forming a recess in the metal layer at the end of the trench, a portion of the metal layer directly beneath the spacer material being removed to form the recess, and lateral sidewalls of the recess not extending beyond vertical sidewalls of the spacer material;
    removing remaining portions of the spacer material;
    depositing a first metal in the recess to fill the recess in the metal layer; and
    depositing a second metal on the first metal to fill the trench.

8. The method of claim 7, wherein the spacer material is selected from a group consisting of a metal, a metal nitride, a metal oxide, a polymer, or combinations thereof.

9. The method of claim 7, wherein removing the portion of the spacer material comprises using an anisotropic etching process.

10. The method of claim 7, wherein the metal layer comprises copper, tungsten, cobalt, rhodium, platinum, or a combination thereof.

11. The method of claim 7, wherein the second metal contacts the first metal.

12. A method of fabricating a semiconductor device, the method comprising:
    depositing a spacer material in a trench arranged in a dielectric layer, an end of the trench extending to a metal layer of an interconnect structure;
    performing an anisotropic process to remove a portion of the spacer material in contact with the metal layer;
    performing a wet etch process to form a recess in the metal layer at the end of the trench, a portion of the metal layer directly beneath the spacer material being removed to form the recess, and lateral sidewalls of the recess not extending beyond vertical sidewalls of the spacer material;
    removing remaining portions of the spacer material; and
    depositing a barrier layer and a metal layer in the trench.

* * * * *